United States Patent
Familia

(10) Patent No.: US 12,381,706 B2
(45) Date of Patent: Aug. 5, 2025

(54) APPARATUS AND METHOD FOR CLOCK PHASE CALIBRATION

(71) Applicant: Intel Corporation, Santa Clara, CA (US)

(72) Inventor: Noam Familia, Modiin (IL)

(73) Assignee: Intel Corporation, Santa Clara, CA (US)

(*) Notice: Subject to any disclaimer, the term of this patent is extended or adjusted under 35 U.S.C. 154(b) by 805 days.

(21) Appl. No.: 17/482,980

(22) Filed: Sep. 23, 2021

(65) Prior Publication Data

US 2023/0090369 A1   Mar. 23, 2023

(51) Int. Cl.
*H04L 7/00* (2006.01)
*H04L 7/02* (2006.01)

(52) U.S. Cl.
CPC .............. *H04L 7/0037* (2013.01); *H04L 7/02* (2013.01)

(58) Field of Classification Search
None
See application file for complete search history.

(56) References Cited

U.S. PATENT DOCUMENTS

| | | | | |
|---|---|---|---|---|
| 5,157,397 A | * | 10/1992 | Vernon | H03M 1/365 341/118 |
| 5,202,744 A | * | 4/1993 | Louis | G01N 21/6408 359/489.08 |
| 7,205,924 B2 | * | 4/2007 | Vemulapalli | H04L 27/361 341/166 |
| 7,289,054 B1 | * | 10/2007 | Watanabe | H03M 3/35 341/143 |
| 7,356,424 B2 | * | 4/2008 | Bohan | H03M 1/109 703/2 |
| 7,443,219 B2 | * | 10/2008 | Rausch | H03K 5/15013 708/290 |

(Continued)

FOREIGN PATENT DOCUMENTS

| | | | | |
|---|---|---|---|---|
| CN | 201215580 Y | * | 4/2009 | |
| CN | 101557214 A | * | 10/2009 | H03K 5/13 |

(Continued)

OTHER PUBLICATIONS

Z. Wang, Y. Zhang, Y. Onizuka and P. R. Kinget, "Multi-Phase Clock Generation for Phase Interpolation With a Multi-Phase, Injection-Locked Ring Oscillator and a Quadrature DLL," in IEEE Journal of Solid-State Circuits, vol. 57, No. 6, pp. 1776-1787, Jun. 2022, doi: 10.1109/JSSC.2021.3124486. (Year: 2022).*

(Continued)

*Primary Examiner* — Berhanu Tadese
(74) *Attorney, Agent, or Firm* — Schwegman Lundberg & Woessner, P.A.

(57) ABSTRACT

Some embodiments include apparatuses and methods using a clock generator to generate clock signals, the clock signals being out of phase with each other; a transmitting circuit to provide patterns of data at an output of the transmitting circuit responsive to timing of the clock signals; and calculation and control circuitry to calculate an integral nonlinearity vector that represents offsets of transitions of the patterns from respective target positions, and to generate control information based on the integral nonlinearity vector to adjust phases of the clock signals based on the control information.

19 Claims, 6 Drawing Sheets

(56) References Cited

U.S. PATENT DOCUMENTS

| | | | | |
|---|---|---|---|---|
| 7,532,053 | B2* | 5/2009 | Rausch | H03K 5/15013 |
| | | | | 708/290 |
| 7,888,973 | B1* | 2/2011 | Rezzi | H03L 7/087 |
| | | | | 327/105 |
| 8,144,045 | B2* | 3/2012 | Nagata | G01R 31/31922 |
| | | | | 341/152 |
| 8,155,174 | B2* | 4/2012 | Kim | G01R 31/31726 |
| | | | | 375/224 |
| 8,386,209 | B2* | 2/2013 | Mullane | H03M 1/1085 |
| | | | | 702/123 |
| 8,634,286 | B1* | 1/2014 | Yang | G11B 20/10046 |
| | | | | 369/47.14 |
| 8,682,613 | B2* | 3/2014 | Hamilton | H03M 1/109 |
| | | | | 702/180 |
| 9,106,247 | B2* | 8/2015 | Hamilton | G06F 17/18 |
| 9,166,843 | B2* | 10/2015 | Huang | H04L 25/4902 |
| 9,246,670 | B2* | 1/2016 | Ahmadi | H04L 7/0016 |
| 9,252,758 | B2* | 2/2016 | Hsieh | H03K 5/13 |
| 9,306,729 | B2* | 4/2016 | Bonaccio | H04L 7/0029 |
| 9,577,816 | B2* | 2/2017 | Hossain | H04L 7/033 |
| 9,608,647 | B1* | 3/2017 | Djahanshahi | H03B 5/1212 |
| 9,698,968 | B2* | 7/2017 | Bonaccio | H03L 7/0814 |
| 9,755,819 | B2* | 9/2017 | Aleksić | H04L 7/033 |
| 9,768,947 | B2* | 9/2017 | Hossain | H03L 7/1974 |
| 10,050,771 | B2* | 8/2018 | Hossain | H03L 7/1974 |
| 10,061,272 | B2* | 8/2018 | Chiu | H03M 1/1245 |
| 10,129,015 | B2* | 11/2018 | Aleksić | H04L 7/033 |
| 10,153,775 | B1* | 12/2018 | Wurzer | H03L 7/0998 |
| 10,200,047 | B2* | 2/2019 | Markulic | H03L 7/081 |
| 10,263,761 | B2* | 4/2019 | Hossain | H04L 27/0014 |
| 10,298,243 | B2* | 5/2019 | Mayer | H03L 7/091 |
| 10,367,636 | B2* | 7/2019 | Aleksic | H04L 25/03 |
| 10,419,008 | B2* | 9/2019 | Djahanshahi | H03B 5/1265 |
| 10,700,687 | B1* | 6/2020 | Attineni | H03L 7/081 |
| 10,797,683 | B1* | 10/2020 | Jain | H03K 5/1565 |
| 10,972,248 | B2* | 4/2021 | Lee | H03L 7/0807 |
| 11,107,419 | B2* | 8/2021 | Pyun | H03L 7/0807 |
| 11,159,151 | B1* | 10/2021 | Lu | H04L 7/0025 |
| 11,212,069 | B2* | 12/2021 | Lee | H04L 7/0079 |
| 11,231,741 | B1* | 1/2022 | Buchwald | H03L 7/07 |
| 11,283,459 | B1* | 3/2022 | Monk | H03L 7/085 |
| 11,870,449 | B2* | 1/2024 | Banin | G06F 1/08 |
| 12,143,116 | B2* | 11/2024 | Sjöland | H03M 1/1028 |
| 2004/0041599 | A1* | 3/2004 | Murphy | H03B 28/00 |
| | | | | 327/129 |
| 2013/0003881 | A1* | 1/2013 | Ingels | H04L 27/122 |
| | | | | 375/259 |
| 2017/0005785 | A1* | 1/2017 | Aleksic | H04L 7/033 |
| 2018/0013544 | A1* | 1/2018 | Aleksic | H04L 25/03057 |
| 2018/0131380 | A1* | 5/2018 | Mayer | H03L 7/0992 |
| 2019/0173661 | A1* | 6/2019 | Aleksic | H04L 25/03057 |
| 2021/0065634 | A1* | 3/2021 | Pyun | G09G 3/3291 |
| 2021/0250161 | A1* | 8/2021 | Lee | H03L 7/0807 |
| 2022/0321137 | A1* | 10/2022 | Monk | H03L 7/087 |
| 2023/0090369 | A1* | 3/2023 | Familia | H04L 7/0091 |
| | | | | 375/371 |

FOREIGN PATENT DOCUMENTS

| | | | | |
|---|---|---|---|---|
| CN | 103973604 A | * | 8/2014 | H03F 1/3241 |
| CN | 104836580 A | * | 8/2015 | H03C 3/0925 |
| CN | 103427798 B | * | 6/2016 | |
| CN | 106374892 A | * | 2/2017 | H03K 5/135 |
| CN | 104378089 B | * | 3/2017 | H04L 25/4902 |
| CN | 110716415 A | * | 1/2020 | G01B 11/22 |
| CN | 114079459 A | * | 2/2022 | |
| CN | 114556788 A | * | 5/2022 | G06F 1/08 |
| CN | 114257220 B | * | 11/2022 | |
| CN | 116438743 A | * | 7/2023 | H03F 3/2175 |
| CN | 116736679 A | * | 9/2023 | |
| CN | 113364450 B | * | 2/2024 | G06F 1/04 |
| CN | 113169738 B | * | 8/2024 | H03L 7/081 |
| EP | 2027654 B1 | * | 8/2011 | H03M 3/35 |
| EP | 2372916 A2 | * | 10/2011 | G06F 17/18 |
| EP | 2541776 A1 | * | 1/2013 | H03M 1/745 |
| EP | 3249817 B1 | * | 12/2018 | H03K 5/159 |
| EP | 4143975 B1 | * | 4/2024 | G04F 10/005 |
| JP | 2011013069 A | * | 1/2011 | G01R 31/31922 |
| TW | 202007090 A | * | 2/2020 | G01B 11/22 |
| TW | 202130123 A | * | 8/2021 | G06F 1/08 |
| WO | WO-2008118659 A1 | * | 10/2008 | G01R 31/31725 |
| WO | WO-2013137863 A1 | * | 9/2013 | H03L 7/1974 |
| WO | WO-2016207758 A1 | * | 12/2016 | H03L 7/1212 |
| WO | WO-2017034702 A1 | * | 3/2017 | G06F 1/10 |
| WO | WO-2018119153 A2 | * | 6/2018 | H01L 23/4855 |
| WO | WO-2021133415 A1 | * | 7/2021 | G06F 1/08 |
| WO | WO-2021219205 A1 | * | 11/2021 | G04F 10/005 |
| WO | WO-2022052705 A1 | * | 3/2022 | |
| WO | WO-2022093344 A1 | * | 5/2022 | H03F 3/2175 |
| WO | WO-2002037684 | * | 10/2022 | H03L 7/18 |
| WO | WO-2022212310 A1 | * | 10/2022 | G04F 10/005 |

OTHER PUBLICATIONS

S. Buhr, C. Hoyer, M. Kreißig and F. Ellinger, "A 10 Bit Phase-Interpolator-Based Digital-to-Phase Converter for Accurate Time Synchronization in Ethernet Applications," 2020 27th IEEE International Conference on Electronics, Circuits and Systems (ICECS), Glasgow, UK, 2020, pp. 1-4 (Year: 2020).*

J. Y. Won, S. I. Kwon, H. S. Yoon, G. B. Ko, J.-W. Son and J. S. Lee, "Dual-Phase Tapped-Delay-Line Time-to-Digital Converter With On-the-Fly Calibration Implemented in 40 nm FPGA," in IEEE Transactions on Biomedical Circuits and Systems, vol. 10, No. 1, pp. 231-242, Feb. 2016, (Year: 2016).*

Buhr et al. A_10_Bit_Phase-Interpolator-Based_Digital-to-Phase_Converter_for_Accurate_Time_Synchronization_in_Ethernet_Applications, IEEE 2020 (Year: 2020).*

Chen et al. A_Low_Nonlinearity_Missing-Code_Free_Time-to-Digital_Converter_Based_on_28-nm_FPGAs_With_Embedded_Bin-Width_Calibration, IEEE 2017 (Year: 2017).*

Wang et al. Multi-Phase_Clock_Generation_for_Phase_Interpolation_With_a_Multi-Phase_Injection-Locked_Ring_Oscillator_and_a_Quadrature_DL, IEEE 2022 (Year: 2022).*

Won et al. Dual-Phase_Tapped-Delay-Line_Time-to-Digital_Converter_With_On-the-Fly_Calibration_Implemented_in_40_nm_FPGA, IEEE 2016 (Year: 2016).*

* cited by examiner

APPARATUS AND METHOD FOR CLOCK PHASE CALIBRATION

TECHNICAL FIELD

Embodiments described herein pertain to clock signals in integrated circuits. Some embodiments relate to calibration of phases of multiple clock signals in transmitters.

BACKGROUND

Transmitters in some electronic devices or systems that operate at a relatively high data rate (e.g., in the gigahertz range) often use multiple clock phases for multiplexing lower rate parallel data at of the transmitter. The spacing between the clock phases are usually adjusted with high accuracy, so that transitions among the clock phases are equally spaced. Unbalanced spacing would impact timing specification. As described below, at certain high rates (e.g., 56G baud rate and higher), meeting some timing specification can be extremely challenging.

DETAILED DESCRIPTION

Even-odd jitter (EOJ) is one of consideration in transmitter (TX) clock specifications. For example, for Ethernet protocols, the EOJ should be less than 25 mUI, which is approximately 220 fs for a 224 Gb PAM4 rate (112G baud rate). Besides the need to meet TX EOJ specification, EOJ could severely impact total jitter because of jitter amplification effects—EOJ is a high frequency jitter and gets amplified by inter symbol interference (ISI). At high rates (e.g., 56G baud rate and above), meeting EOJ spec becomes extremely challenging. Some conventional techniques use quad clocking with complementary I and Q clocks in high-rate transmitters. However, such techniques can limit the degree of freedom and simplifies the alignment process. For example, a quad clocking for TX at 112G baud rate often use 28 GHz clocks, which has few challenges such as narrower phase-locked loop (PLL) frequency range, reliability, jitter amplification effects, and challenging setup time requirements at the final stage of the transmitter, such as at the parallel-in serial-out (PISO) final stage. If the complementary phases of the quad clock are unbalanced, the EOJ would be high without being able to fix it.

The techniques described herein involve using multiple clock signals the form an octal clocking scheme (an 8-phase clocking) and adjusting the phases of clock signals. In an example, the described techniques include generating different clock patterns at an output if a transmitter, and calculating an integral nonlinearity (INL) vector that represents the offset of the transitions of the patterns of data from their target positions (e.g., ideal positions). Based on the INL vector, the phases of the clock signals are individually and linearly tuned such that the INL vector approaches zero. Convergence of the described INL vector is relatively fast because phases are corrected proportionally to their position errors. The techniques described herein allows the described transmitters to operate at a relatively high-rate (e.g., 56G, 112G, and higher) in Serializer/Deserializer (SerDes) architectures. The techniques described herein can also be applicable to other clocking architecture besides the example octal clocking scheme. Other improvements and benefits of the described techniques are discussed below with reference to FIG. 1 through FIG. 6.

Figure 1:
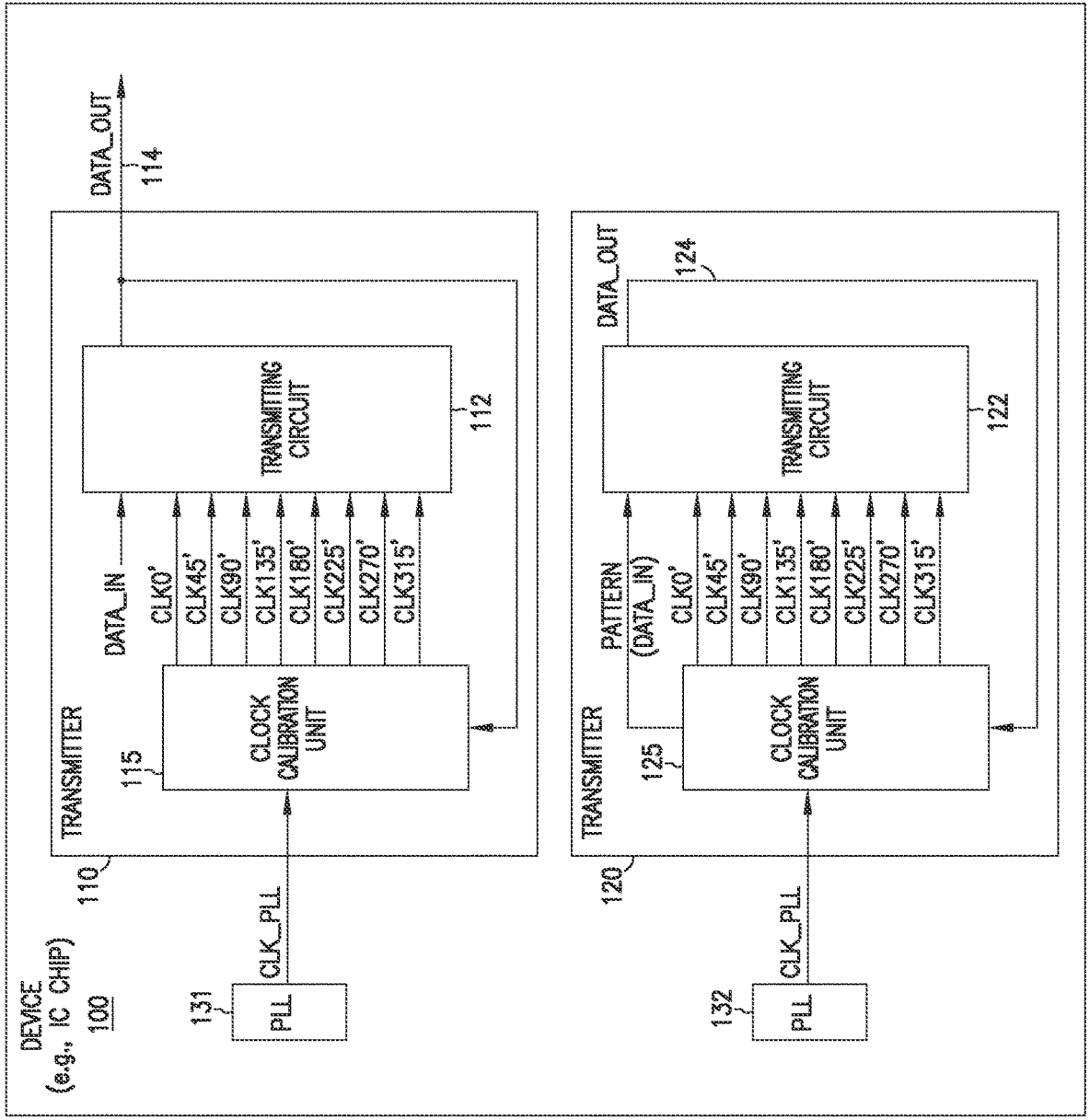
FIG. 1 shows an apparatus in the form of a device including transmitters, according to some embodiments described herein.

FIG. 1 shows an apparatus in the form of a device 100 according to some embodiments described herein. Device 100 can include or can be included in an integrated circuit (IC) chip. Device 100 can be a system-on-chip (SoC) or part of an SoC. Device 100 can include or can be part of a transceiver that can include a SerDes interface components (e.g., circuitry). As shown in FIG. 1, device 100 can include a die (e.g., a semiconductor die) 101 where component of device 100 are located (e.g., formed in or formed on). Device 100 can include a transmitter 110, a transmitter 120, a PLL 131, and a PLL 132, all of which can be formed on the same die (e.g., die 101). Device 100 and include a transceiver, such that transmitters 110 and 120 can be part of the transceiver. Thus, device 100 can also a receiver that can be part of the transceiver. For simplicity, the receiver and other components of device 100 are omitted from FIG. 1 so as to not obscure the embodiments described herein.

As shown in FIG. 1, transmitters 110 and 120 can include transmitting circuits 112 and 122, respectively. Transmitter 110 can include an output (e.g., output node or nodes) 114, which can also be an output of transmitting circuit 112. Transmitter 120 can include an output (e.g., output node or nodes) 124, which can also be an output of transmitting circuit 122. In an example, transmitters 110 and 120 can operate to transmit data at a relatively high rate (e.g., rate in the gigabit per second (Gb) range, up to 224 Gb or higher).

Transmitters 110 and 120 can include clock calibration units 115 and 125, respectively. Each clock calibration units 115 and 125 can be configured to perform a clock calibration operation to adjust (e.g., calibrate) the timing (e.g., clock phases) of clock signals used a respective transmitter. For example, clock calibration unit 115 can be configured to perform a clock calibration operation to adjust clock signals used in transmitter 110. Clock calibration unit 125 can be configure to perform a clock calibration operation to adjust clock signals used in transmitter 110. A clock calibration operation is described in detail below with reference to FIG. 2 through FIG. 5. Configuring clock calibration units 125 and 125 in FIG. 1 to perform the clock calibration operation described herein can include providing specific components in each of clock calibration units 115 and 125 to perform the described operations. Such specific components can include firmware, hardware, or software or any combination of firmware, hardware, and software. As an example, each of clock calibration units 125 and 125 can include components such as a state machine (e.g., finite state machine), register circuits (e.g., control registers 121), read-only-memory (ROM), and other components that can be configured to perform the clock calibration operation and other operations and activities (activities associated with method 500 of FIG. 5) described herein.

As shown in FIG. 1, clock calibration unit 115 can receive a clock signal CLK_PLL from PLL 131. Clock calibration unit 125 can receive a clock signal CLK_PLL from PLL 132. Each of clock calibration units 115 and 125 can generate multiple clock signals (e.g., eight clock signals CLK0 through CLK315 shown in FIG. 2) having different clock phases based on clock signal CLK_PLL. Each of clock calibration units 115 and 125 can perform its own clock calibration operation to adjust the timing (e.g., clock phases) of the multiple clock signals and provide adjusted (e.g., calibrated) clock signals to respective transmitting circuits 112 and 122.

In FIG. 1, clock signals CLK0', CLK45', CLK90', CLK135', CLK180', CLK225', CLK270', and CLK315' (collectively referred to as clock signals CLK0'-CLK315') are adjusted (e.g., calibrated) clock signals. Clock signals CLK0'-CLK315' are 45 degrees out of phase with each other, such that they can provide an octal clocking scheme (an octal clock) that has eight equal phases (45 degrees each phase) within 360 degrees. Each of transmitting circuits 112 and 122 can use its own set of clock signals CLK0'-CLK315' to transmit data (e.g., output data) DATA_OUT at respective output 114 and 124.

As shown in FIG. 1, transmitting circuit 112 of transmitter 110 can include an input (e.g., data input nodes, not labeled) to receive data DATA_IN (e.g., input data) from a data source (not shown) inside device 100. Transmitting circuit 112 can transmit data DATA_IN as data DATA_OUT at output 114. Output 114 can be coupled to additional device (an external device, not shown) that is different from device 100. Thus, data DATA_OUT at output 114 can be transmitted from transmitter 110 of device 100 to an additional device (an external device, not shown) during an operation (a normal operation) of device 100. As shown in FIG. 1, output 114 can also be coupled (internally coupled to) clock calibration unit 115. During a clock calibration operation performed by clock calibration unit 115, data DATA_OUT at output 114 can be used by clock calibration unit 115 as part of calculations associated with the clock calibration operation to calibrate clock signals (e.g., clock signals CLK0'-CLK315') used in transmitter 110.

As shown in FIG. 1, transmitting circuit 122 of transmitter 120 can include an input (e.g., data input nodes, not labeled) to receive patterns of data (labeled PATTERS in FIG. 1). The patterns of data PATTERNS are input data like input data DATA_IN at transmitting circuit 112. The patterns of data PATTERNS can be provided to transmitting circuit 122 by clock calibration unit 125 during a clock calibration operation performed by clock calibration unit 125. The patterns of data PATTERNS can be viewed as input data (e.g., data DATA_IN) provide to transmitting circuit 112 during clock calibration operation. Transmitting circuit 122 can transmit the patterns of data PATTERNS (e.g., input data) as data DATA_OUT at output 124. Unlike output 114 of transmitter 110, output 124 of transmitter 120 may not be coupled to additional device (not shown) that is different from device 100. Thus, data DATA_OUT at output 124 may not be transmitted from transmitter 120 of device 100 to an additional device (not shown). However, as shown in FIG. 1, output 124 can be coupled to clock calibration unit 125 of transmitter 120. During a clock calibration operation performed by clock calibration unit 125, data DATA_OUT at output 124 can be used by clock calibration unit 125 as part of calculations associated with the clock calibration operation to calibrate clock signals CLK0'-CLK315'. Device 100 can use clock signals CLK0'-CLK315' from clock calibration unit 125 as clock signals for normal operations of another transmitter (not shown) of device 100.

Figure 2:
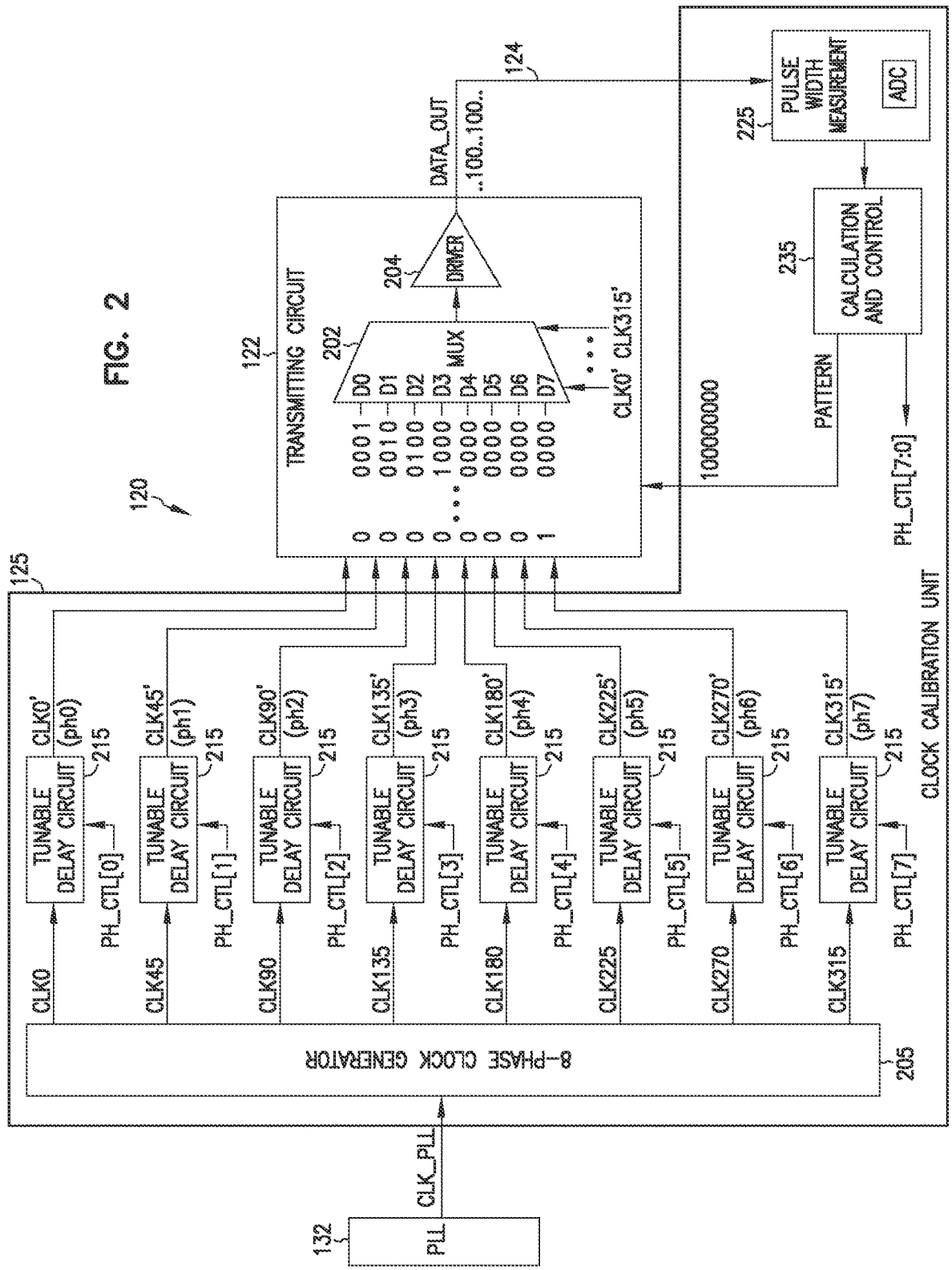
FIG. 2 shows a block diagram of one of the transmitters of FIG. 1 including detail of a clock calibration unit, according to some embodiments described herein.

FIG. 2 shows a block diagram of transmitter 120 of FIG. 1 including detail of clock calibration unit 125, according to some embodiments described herein. As shown in FIG. 2, clock calibration unit 125 can include an 8-phase clock generator 205 to receive clock signal CLK_PLL and generate clock signals CLK0, CLK45, CLK90, CLK135, CLK180, CLK225, CLK270, and CLK315 (collectively referred to as clock signals CLK0-CLK315) based on clock signal CLK_PLL. Clock signals CLK0-CLK315 can have the same frequency but they are 45 degrees out of phase with each other, such that they can provide an octal clocking scheme (8-phase clock signal) that has eight equal phases (45 degrees each phase) within 360 degrees.

As shown in FIG. 2, clock calibration unit 125 can include tunable delay circuits (e.g., tunable delay circuitry) 215 that can respond to control information (e.g., digital control codes) PH_CTL[0] through PH_CTL[7] to adjust the phases (clock phases) of clock signals CLK0-CLK315, respectively, based on the values (the values of the digital control codes) of respective control information PH_CTL[0] through PH_CTL[7]. Clock signals CLK0'-CLK315' are delayed versions of clock signals CLK0-CLK315, respectively, and have the same frequency as clock signals CLK0-CLK315. Thus, adjusting the phases of clock signals CLK0-CLK315 also results in adjusting (e.g., calibrating) the phases of clock signals CLK0'-CLK315', respectively.

Tunable delay circuits 215 can include respective inputs (not labeled) to receive respective clock signals CLK0-CLK315 and respective inputs (not labeled) to receive respective control information PH_CTL[0] through PH_CTL[7]. Tunable delay circuits 215 can adjust phases of respective clock signals CLK0-CLK315 (which results in adjusting the clock phases of respective clock signals CLK0'-CLK315') by applying respective amounts of time delay to clock signals CLK0-CLK315. The amounts of time delay applied by tunable delay circuits 215 are based on the values of respective control information PH_CTL[0] through PH_CTL[7]. The values (digital values) of control information PH_CTL[0] through PH_CTL[7] can be different from each other. Thus, the amount of time delay applied to a clock signal (e.g., one of clock signal CLK0) by a tunable delay circuit 215 can be different from the amount of time delay applied to another clock signal (e.g., clock signal CLK45) by another tunable delay circuit 215. Control information PH_CTL[0] through PH_CTL[7] have respective values proportional to position errors of the phases the respective clock signals CLK0'-CLK315'. Thus, positions errors in phases of clock signals CLK0'-CLK315' can be corrected proportionally to their position errors.

A clock calibration operation performed by clock calibration unit 125 can include many cycles (e.g., iterations). Clock calibration unit 125 can update the values (digital values) of control information PH_CTL[0] through PH_CTL[7] from one cycle to the next. Clock calibration unit 125 can stop updating the values of control information PH_CTL[0] through PH_CTL[7] and end the clock calibration operation when calibration criteria is met (described below with reference to FIG. 4 and FIG. 5).

In a particular cycle of a clock calibration operation, tunable delay circuit 215 controlled by control information PH_CTL[1] can apply an amount of time delay to clock signal CLK45 based on the value of control information PH_CTL[1] in that particular cycle. Then, in a next cycle of the same clock calibration operation, clock calibration unit 125 can update the value of control information PH_CTL [1]. This causes tunable delay circuit 215 controlled by control information PH_CTL[1] to adjust (e.g., increase or decrease) the amount of time delay applied to clock signal CLK45 based on the updated value of control information PH_CTL[1]. Adjusting the amount of time delay applied to clock signal CLK45 causes the phase of clock signal CLK45 to change (e.g., to shift left or shift right). Similarly, clock calibration unit 125 can update the values other control information (PH_CTL[0] and PH_CTL[2] through PH_CTL [7]) from one cycle to the next to adjust the amounts of time delay applied to the other clock signals.

As shown in FIG. 2, transmitting circuit 122 can include a multiplexer (MUX), which can be an 8:1 MUX, and a driver 204. MUX 202 can include input (e.g., input nodes) to receive data that can include bits received in parallel (e.g., bits D0 through D7). MUX 202 can pass the data received at its input to its output (coupled to driver 204) in a series fashion using timing provided by clock signals CLK0'-CLK315'. The data received at the input of MUX 202 can be patterns of data PATTERN. Each pattern of data can be presented by a signal that has different signal levels (e.g., voltage levels). The signal levels can include a high level (e.g., a logic high level (e.g., "1")) and a low level (e.g., a logic low level (e.g., "0")). The high and low signal levels can correspond to different voltage levels (e.g., high and low voltage levels) provided to the signal.

As shown in FIG. 2, MUX 202 can receive patterns of data in which each pattern of data can be represent by a signal having pattern 10000000 (an 8-UI pattern of 1-high level and 7-low signal levels). As shown in FIG. 2, patterns 10000000 can be provided to the input of MUX 202 in a shifted fashion, such that the first bit (e.g., bit "1" corresponding to the first UI of the signal presenting pattern 10000000) of a respective pattern 10000000 can be provided to different input of MUX 202. As described in more detail with reference to FIG. 3, a UI can be a time interval from one clock phase to the next clock phase. In FIG. 2, pattern 10000000 can be a static control code that can be provided to MUX 202 by clock calibration unit 125 during a clock calibration operation.

Driver 204 of transmitting circuit 122 can include an input (e.g., input node (or nodes)) coupled to the output of MUX 202, and an output (e.g., output node (or nodes)) coupled to output 124 of transmitter 120. Driver 204 can operate to transmit the data (received from MUX 202) from its input to output in a series fashion in the form of data DATA_OUT at output 124 of transmitter 120. Data DATA_OUT can include a repeating pattern of data based on the input data provided to MUX 202. Thus, data DATA_OUT can include a signal that has many transitions between different voltage levels (e.g., between a lower voltage level and a higher voltage levels). Each transition can be a high-to-low transition (a transition from a higher voltage level to a lower voltage level) or a low-to-high transition (a transition from a lower voltage level to a higher voltage level).

Clock calibration unit 125 can include pulse width measurement circuitry 225 that can operate to measure the pulse width (PW) of a portion of a signal (e.g., a symbol) that represents data (e.g., a bit of data) transmitted during a unit interval (UI) at output 114 of transmitter 120. As an example, as shown in FIG. 2, pulse width measurement circuitry 225 can include an analog-to-digital converter (ADC), which can operate to measure the average of the pattern of data (presented by data DATA_OUT) at output 124 to provide the value (e.g., a digital code) corresponding to the pulse width PW of a UI associated with of a portion of a signal that represents data (e.g., a bit of data) transmitted in one UI.

Clock calibration unit 125 can include calculation and control circuitry 235 that can operate to provided patterns to MUX 202, as described above. Calculation and control circuitry 235 can also operate to performs different calculations (described in detail below with reference to FIG. 5) based on information from pulse width measurement circuitry 225. Calculation and control circuitry 235 can generate control information PH_CTL[0] through PH_CTL[7] based on the calculations. Clock calibration unit 125 can use control information PH_CTL[0] through PH_CTL[7] to cause tunable delay circuits 215 to adjust (e.g., increase or decrease) respective amounts of time applied to clock signals CLK0-CLK315 to adjust (e.g., calibrate) clock phases of respective clock signals CLK0'-CLK315'. As described above, calculation and control circuitry 235 can update the values of control information PH_CTL[0] through PH_CTL [7] in many cycles (e.g., iterations) of a clock calibration operation until calibration criteria is met (described below with reference to FIG. 4 and FIG. 5).

Figure 3:
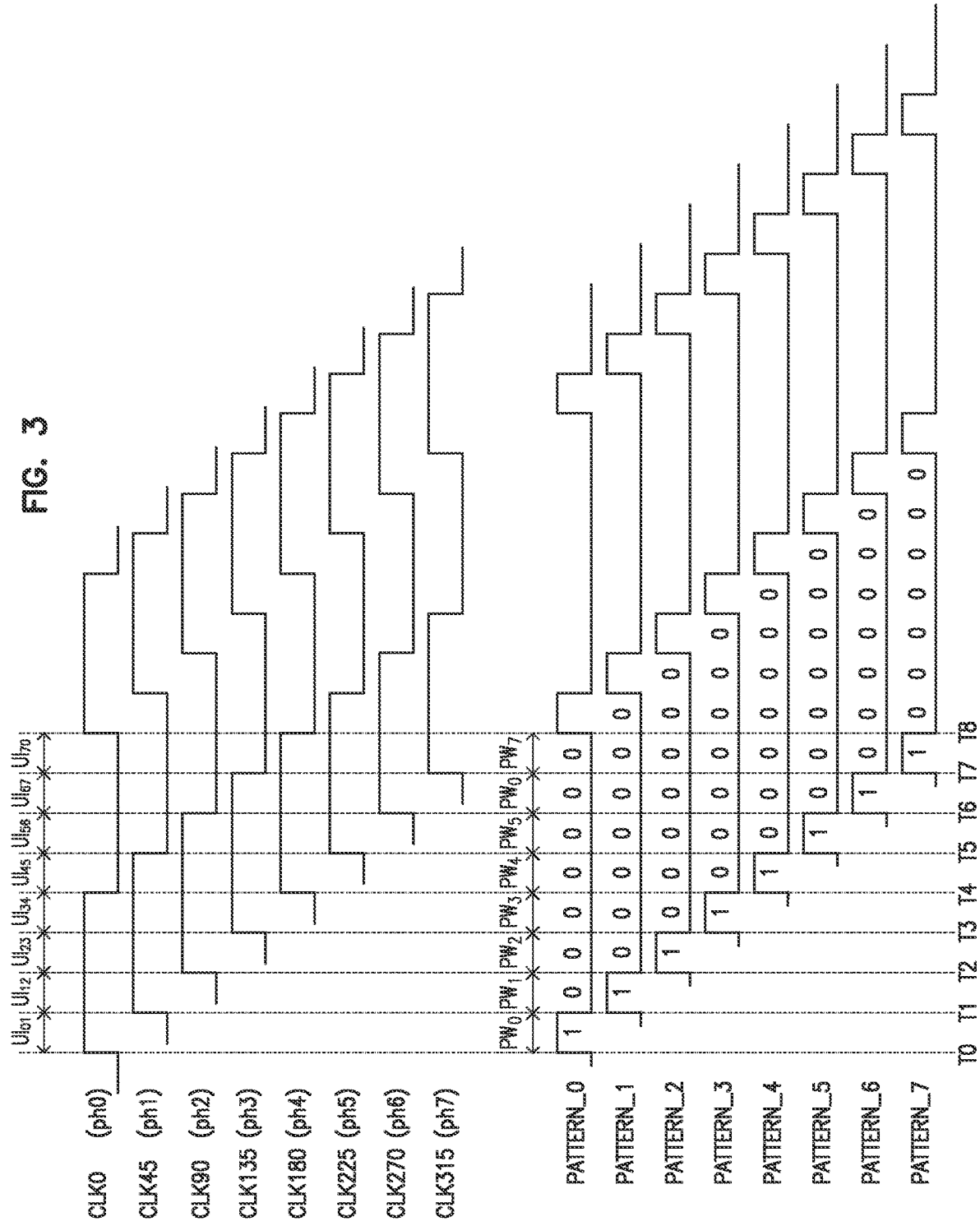
FIG. 3 shows a timing diagram of clock signals used in the transmitter of FIG. 2 and an example of patterns of data used in a calibration operation, according to some embodiments described herein, according to some embodiments described herein.

FIG. 3 shows timing diagram of clock signals CLK0'-CLK315' and an example of patterns of data used in a calibration operation, according to some embodiments described herein. Number 0, 45, 90, 90, 135, 180, 225, 270, or 315 associated with a clock signal in FIG. 3 indicates the phase (in degrees) of that clock signal. As shown in FIG. 3, clock signals CLK0'-CLK315' can form an octal clocking scheme that includes eight equal clock phases.

In FIG. 3, each of times T0 through T8 represents a point in time corresponding to the occurrence of an edge (e.g., a rising edge) of a respective clock signal among clock signals CLK0-CLK315, respectively. As shown in FIG. 3, each of clock phases ph0 through ph7 can start at an edge (e.g., rising edge) of and end at a next edge (e.g., rising edge) of a next clock signal. For example, clock phase ph0 can start a rising edge clock signal CLK0 and end at a rising edge of clock signal CLK45. In another example, clock phase ph7 can start a rising edge clock signal CLK315 and end at a rising edge of clock signal CLK0. Clock phases ph0 through ph7 can repeat many times until the end of a clock calibration operation.

FIG. 3 also shows eight unit intervals (UIs) $UI_{01}$, $UI_{12}$, $UI_{23}$, $UI_{34}$, $UI_{45}$, $UI_{56}$, $UI_{67}$, and $UI_{70}$ that can be associated with time intervals between respective clock phases ph0 through ph7. For example, unit interval $UI_{01}$ can start at clock phase ph0 and end at clock phase ph1. Unit interval $UI_{12}$ can start at clock phase ph1 and end at clock phase ph2, and so on for other unit intervals.

Patterns PATTERN_0 through PATTERN_7 are input data (input patterns of data) provided to MUX 202 during a clock calibration operation, as described above with reference to FIG. 2. As shown in FIG. 3, patterns PATTERN_0 through PATTERN_7 can have the same value (e.g., 10000000 corresponding 1-high and 7-low signal levels, as described above)). Each of patterns PATTERN_0 through PATTERN_7 can include a repeating pattern of one unit interval of a signal level (e.g., the signal level associated with "1") followed by seven consecutive unit intervals of another (different) signal level (e.g., the signal level associated with "0"). The signal level associated with "1" is higher (has a higher voltage) than the signal level associated with "0".

As shown in FIG. 3, each of patterns PATTERN_0 through PATTERN_7 can be associated with one of clock phases ph0 through ph7, such that the bits associated with "1s" of patterns PATTERN_0 through PATTERN_7 can be associated with clock phases ph0 through ph7, respectively, as shown in FIG. 3. Thus, bits associated with "1s" of patterns PATTERN_0 through PATTERN_7 can be provided with to MUX 202 (FIG. 2) during unit intervals $UI_{01}$, $UI_{12}$, $UI_{23}$, $UI_{34}$, $UI_{45}$, $UI_{56}$, $UI_{67}$, and $UI_{70}$ (associated with clock phases ph0 through ph7, respectively). This means that the bit associated with "1" of each pattern can be provided to MUX 202 in FIG. 2 at a different clock phase. For example, the first bit (e.g., bit "1") of pattern PATTERN_0 can be provided to MUX 202 at the start of clock phase ph0 (that can correspond to unit interval $UI_{01}$). The first bit (e.g., bit "1") of pattern PATTERN_1 can be provided to MUX 202 at the start of clock phase ph1 (that can correspond to unit interval $UI_{12}$), and so on for other patterns. The value (e.g., "10000000") of each of patterns PATTERN_0 through PATTERN_7 can repeat after every eight unit intervals, as shown in FIG. 3.

Unit intervals $UI_{01}$, $UI_{12}$, $UI_{23}$, $UI_{34}$, $UI_{45}$, $UI_{56}$, $UI_{67}$, and $UI_{70}$ can have pulse widths $PW_0$, $PW_1$, $PW_2$, $PW_3$, $PW_4$, $PW_5$, $PW_6$, and $PW_7$ (collectively referred to as $PW_0$-$PW_7$). Because clock phases ph0 through ph7 are rotating, an average pulse width (PW_average) among pulse widths $PW_0$-$PW_7$ can remain constant during a clock calibration operation. Pulse widths $PW_0$-$PW_7$ would be equal to the average pulse width at the end of the clock calibration operation at which output transitions (e.g., high-to-low transition and low-to-high transition) of the signal that represent data DATA_OUT at output 114 (FIG. 2) are within specification (e.g., are equally spaced).

Figure 4:
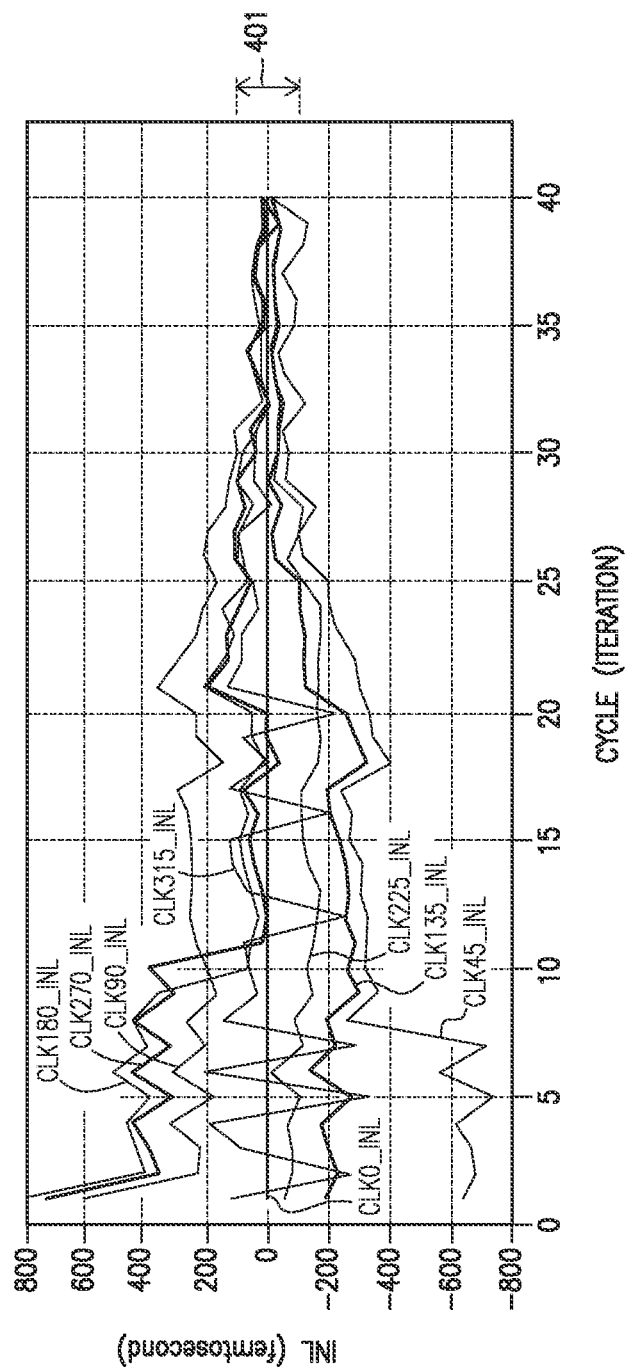
FIG. 4 is a graph showing convergence of INL indicating a gradual decrease in position errors of the clock phases during an example clock calibration operation, according to some embodiments described herein.

FIG. 4 is graph showing convergence of INL indicating a gradual decrease in position errors of clock phases ph0 through ph7 during an example clock calibration operation, according to some embodiments described herein. In FIG. 4, eight curves CLK0_INL, CLK45_INL, CLK90_INL, CLK135_INL, CLK180_INL, CLK225_INL, CLK270_INL, and CLK315_INL present the INL (e.g., phase errors) of clock phases ph0 through ph7 (FIG. 3), respectively. Label CYCLE in the graph represent the number of cycles (e.g., iterations) that clock calibration unit 125 (FIG. 2) performs during a clock calibration operation. In the example of FIG. 4, clock calibration unit 125 performs 40 cycles in the clock calibration operation in which cycle 1 can correspond to the start of a clock calibration operation and cycle 40 can correspond to the end of the clock calibration operation). Thus, in the example of FIG. 4, the INL of clock phases can converge at at cycle 40 of the clock calibration operation.

Label INL (in time unit (e.g., femtosecond (fs))) in graph represents integral nonlinearity of the offsets (e.g., errors) of output transitions from their respective target positions (e.g., ideal positions). The target position of a transition can be a position of that transition relative to reference position. For example, as described above, pattern of data at output 124 (FIG. 2) can be presented by a signal at output 124. A certain edge of a transition (e.g., a low-to-high transition or as high-to-low transition) of the signal can be selected to be a reference edge (e.g., edge zero). Then, a first edge from the reference edge should appear 1 UI away (which is the target position of the first edge) from the reference edge, a second edge from the reference edge should appear 2 UIs away (which is the target position of the second edge) from the reference edge, and so on. An offset (e.g., an error) of a particular transition (of the pattern) from respective target position happens when an edge associated with that particular transition occurs at a position different from the target position. The offset can be corrected by the clock calibration operation described herein.

In FIG. 4, range 401 represents selected range (e.g., a target range). Range 401 indicates peak-to-peak INL values in time units (e.g., femtoseconds) that can be predetermined (e.g., based on designed specification). Peak-to-peak INL can indicate the value (in time units) of the offsets of output transitions from their respective target positions. Range 401 can be one of calibration criteria and can be predetermined and preset (e.g., stored in a register) in device 100 of FIG. 1. Clock calibration unit 125 can end the clock calibration operation when calibration criteria is met. For example, after a clock calibration operation is started, clock calibration unit 125 can end the clock calibration operation when peak-to-peak values of the INL is within range 401. As an example, if range 401 is selected to be (e.g., set at) 100 fs, then clock calibration unit 125 can stop the clock calibration operation when the peak-to-peak values of the INL is within 100 fs.

As shown in FIG. 4, at the start of the example clock calibration operation (e.g., from cycle 1), the peak-to-peak INL of clock phases ph0 through ph7 can be relatively large (e.g., about 1400 femtoseconds). As clock calibration operation progresses from cycle 1 to cycle 40, the INL of clock phases ph0 through ph7 gradually decrease and converge to respective values within range 401 (e.g., after 40 cycles). This can mean that, in the example of FIG. 4, calibration criteria (e.g., conditions) are met (e.g., at cycle number 40). Thus, clock calibration unit 125 can end the clock calibration operation after cycle 40.

The above example uses range 401 as an example. Alternative, or additionally, a number of cycles (e.g., X cycles, wherein X is an integer) can be used as one of calibration criteria (which can be predetermined and can be preset (e.g., stored) in device 100 of FIG. 1). For example, device 100 can store a selected number of cycles (e.g., X) that can be predetermined (e.g., based on characterizing (e.g., simulation) of transmitter 120 of FIG. 1). Then, a clock calibration operation can end when the number of cycles during a clock calibration operation reaches X (the stored value). In some examples, the selected number of cycles (e.g., X) can be selected such that it can be equal to or greater than a value of the number of cycles at which the INL of clock phases ph0 through ph7 are within range 401. For example, using the example of FIG. 4, the value of X can be selected to be equal to 40 or greater than 40 (e.g., X=40 or X>40). In the example of FIG. 4, the smaller the difference between X and 40 the sooner the clock calibration operation can end after the number of the cycles reaches 40. The larger the difference between X and 40 (using the example of FIG. 4) the longer it takes for the clock calibration operation to end after the number of the cycles reaches 40. However, a larger difference (e.g., a higher value for X) may further reduce the INL of clock phases ph0 through ph7 in comparison with the INL of clock phases ph0 through ph7 at cycle 40 (using the example of FIG. 4).

Thus, shown in FIG. 4, device 100 (FIG. 1) can perform a clock calibration operation to reduce INL of clock phases ph0 through ph7 (FIG. 3), so that output transitions can be within specification. The clock calibration operation can end after the INL is within a selected range (e.g., range 401), after the number of cycles performed in the clock calibration operation reaches a selected value (e.g., X cycles), or both (e.g., after the INL is within a selected range and after the number of cycles performed in the clock calibration operation reaches a selected value).

Figure 5:
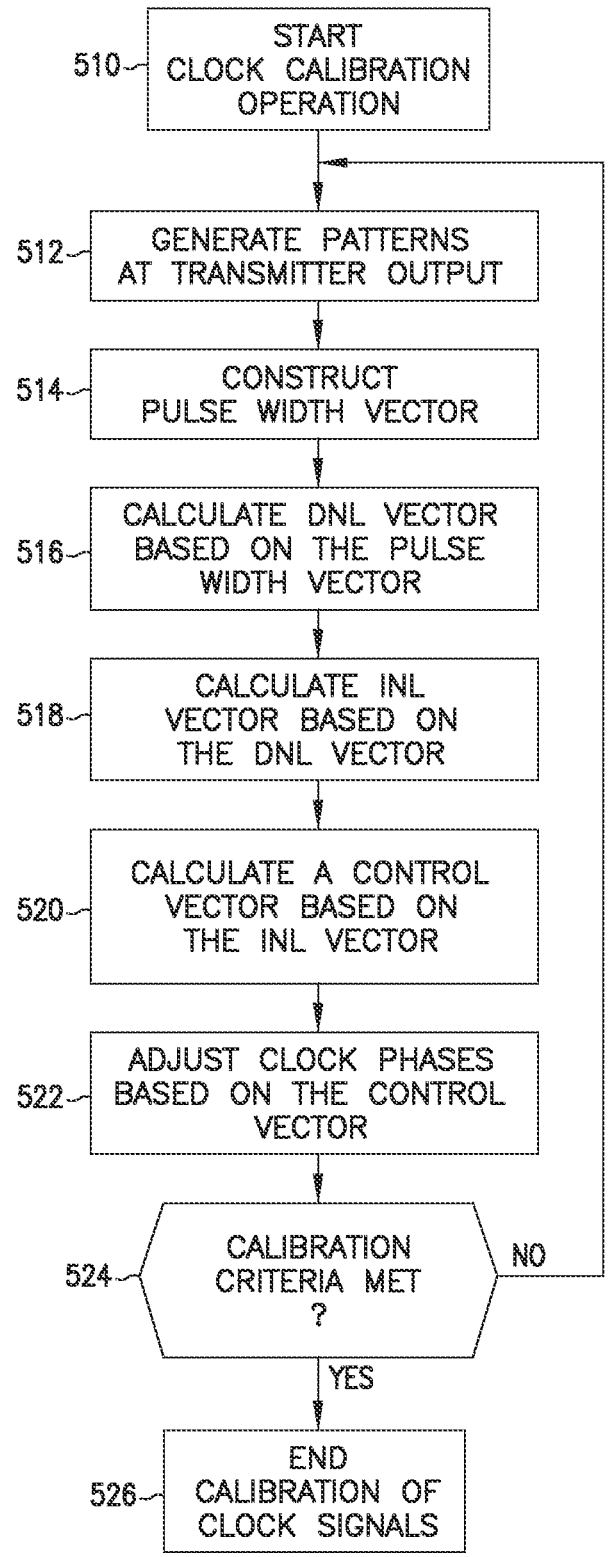
FIG. 5 is a flowchart showing a method of calibrating clock signals in clock calibration operation, according to some embodiments described herein.

FIG. 5 is a flowchart showing a method 500 of calibrating clock signals in a clock calibration operation, according to some embodiments described herein. Method 500 can be performed by clock calibration unit 125 of FIG. 2. As described above, clock calibration unit 125 can include components can that can include firmware, hardware, or software or any combination of firmware, hardware, and software to perform a clock calibration operation described herein. Thus, method 500 can be performed by any combination of firmware, hardware, and software.

As shown in FIG. 5, method 500 can begin at activity 510, which can start a clock calibration operation. Clock calibration unit 125 (FIG. 2) can start activity 510 during a power-on stage (e.g., during initialization process) of device 100 (FIG. 1) or a system (e.g., SoC) that include device 100. Alternatively, clock calibration unit 125 can start activity 510 after power-on stage of device 100.

Activity 512 can include generating patterns of data at output 124 of transmitter 120 (FIG. 2) for the clock calibration operation. The patterns of data can be data DATA_OUT that has patterns based to patterns PATTERN_0 through PATTERN_7 (FIG. 3) provided to MUX 202 (FIG. 2).

Activity 514 can include constructing a pulse width vector (PW vector), as shown below.

$$PW = \begin{pmatrix} UI_{70} \\ UI_{01} \\ UI_{12} \\ UI_{23} \\ UI_{34} \\ UI_{45} \\ UI_{56} \\ UI_{67} \end{pmatrix}$$

In the PW vector shown above, each of unit intervals $UI_{01}$, $UI_{12}$, $UI_{23}$, $UI_{34}$, $UI_{45}$, $UI_{56}$, $UI_{67}$, and $UI_{70}$ contain information associated with the values of pulse width $PW_0$-$PW_7$, respectively. The PW vector can be constructed based on measurements of unit intervals associated with output data (e.g., a repeating pattern of 10000000) at output 124 (FIG. 2) of transmitting circuit 122. Since eight patterns of data (PATTERN_0 through PATTERN_7 in FIG. 3) are used for the clock calibration operation, activity 514 can include performing eight measurements where each measurement can be used to calculate the average pulse width with associate with one of the eight UIs (one of $UI_{01}$, $UI_{12}$, $UI_{23}$, $UI_{34}$, $UI_{45}$, $UI_{56}$, $UI_{67}$, and $UI_{70}$ $I_{01}$, $UI_{12}$) during transmitting of a respective pattern of data at output 124. For example, a first measurement can measure the pulse width from clock phase ph0 to clock phase ph1 (associated with $UI_{01}$). A second measurement can measure the pulse width from clock phase ph1 to clock phase ph2 (associated with $UI_{12}$), and so on, such that the eighth measurement (last measurement) can measure the pulse width from clock phase ph6 to clock phase ph7 (associated with $UI_{70}$).

Activity 516 can include calculating a differential non-linearity (DNL) vector $PW_{DNL}$ for each of clock phases ph0 through ph7. The DNL vector $PW_{DNL}$ is shown below.

$$PW_{DNL} = PW - PW\_average$$

In the DNL vector above, PW_average is the average of eight pulse widths. Thus, activity 514 can also include calculating an average of the pulse width using information from the pulse with vector.

Activity 518 can include calculating an INL vector $PW_{INL}$ (shown below) for each of clock phases ph0 through ph7. The INL vector is accumulated sum of the DNL vector.

$$PW_{INL} = \begin{pmatrix} 0 \\ PW_{INL}[0] + PW_{DNL}[1] \\ PW_{INL}[1] + PW_{DNL}[2] \\ PW_{INL}[2] + PW_{DNL}[3] \\ PW_{INL}[3] + PW_{DNL}[4] \\ PW_{INL}[4] + PW_{DNL}[5] \\ PW_{INL}[5] + PW_{DNL}[6] \\ PW_{INL}[6] + PW_{DNL}[7] \end{pmatrix}$$

The INL vector $PW_{INL}$ indicates the position errors clock phases ph0 through ph7 (FIG. 3) that also correspond to offsets of output transitions (e.g., high-to-low transition and low-to-high transition) from respective target positions the signal that represent data DATA_OUT (e.g., pattern PATTERN_0 through PATTERN_7) at output 114 (FIG. 2) of transmitter 120.

Eight rows (from top to bottom) of the INL vector above contain information corresponding the INLs of clock phases ph0 through ph7, respectively. Clock phase ph0 can be used as a reference clock phase, such that the INL of clock phase ph0 is 0 (by definition) as shown in the top row in the INL vector above.

In the INL vector $PW_{INL}$, $PW_{INL}[0]+PW_{DNL}[1]$ (the INL of clock phase ph1) is the sum of $PW_{INL}$ [0] (the INL of clock phase ph0) and $PW_{DNL}[1]$ (the DNL of clock phase ph1, calculated from the DNL vector above).

In the INL vector $PW_{INL}$, $PW_{INL}[1]+PW_{DNL}[2]$ (the INL of clock phase ph2) is the sum of $PW_{INL}$ [1] (the INL of clock phase ph1) and $PW_{DNL}[2]$ (the DNL of clock phase ph2, calculated from the DNL vector above).

In the INL vector $PW_{INL}$, $PW_{INL}[2]+PW_{DNL}[3]$ (the INL of clock phase ph3) is the sum of $PW_{INL}$ [2] (the INL of clock phase ph2) and $PW_{DNL}[3]$ (the DNL of clock phase ph3, calculated from the DNL vector above).

In the INL vector $PW_{INL}$, $PW_{INL}[3]+PW_{DNL}[4]$ (the INL of clock phase ph4) is the sum of $PW_{INL}$ [3] (the INL of clock phase ph3) and $PW_{DNL}[4]$ (the DNL of clock phase ph4, calculated from the DNL vector above).

In the INL vector $PW_{INL}$, $PW_{INL}[4]+PW_{DNL}[5]$ (the INL of clock phase ph5) is the sum of $PW_{INL}$ [4] (the INL of clock phase ph4) and $PW_{DNL}[5]$ (the DNL of clock phase ph5, calculated from the DNL vector above).

In the INL vector $PW_{INL}$, $PW_{INL}[5]+PW_{DNL}[6]$ (the INL of clock phase ph6) is the sum of $PW_{INL}$ [6] (the INL of clock phase ph5) and $PW_{DNL}[6]$ (the DNL of clock phase ph6, calculated from the DNL vector above).

In the INL vector $PW_{INL}$, $PW_{INL}[6]+PW_{DNL}[7]$ (the INL of clock phase ph7) is the sum of $PW_{INL}$ [7] (the INL of clock phase ph6) and $PW_{DNL}[7]$ (the DNL of clock phase ph7, calculated from the DNL vector $PW_{DNL}$).

Activity 520 can include calculating a control vector PH_CTL (shown below) that provide information to control the amount of time delay applied by respective tunable delay circuits 215 to clock signals CLK0-CLK315 (FIG. 2) associated clock phases ph0 through ph7.

$$PH\_CTL = \begin{pmatrix} ph_0 \\ ph_1 \\ ph_2 \\ ph_3 \\ ph_4 \\ ph_5 \\ ph_6 \\ ph_7 \end{pmatrix}$$

Each of clock phases ph0 through ph7 can have a separate control. Based on the position error of each clock phase, a proportional correction can be applied to clock phases ph0 through ph7, as shown in equation (1) below.

$$PH\_CTL[i]_{n+1} = PH\_CTL[i]_n - K*PW_{INL} \quad (1)$$

In equation (1) above, index i is from 0 to 7 and corresponds to the index of eight clock phases ph0 through ph7. Thus, there can be eight control information PH_CTL[0] through PH_CTL[7] (like control information PH_CTL[0] through PH_CTL[7] shown in FIG. 2). In equation (1), "*" represents multiplication. Index n in represent the $n^{th}$ cycle performed by clock calibration unit 125 at a particular time. For each clock phase, clock calibration unit 125 can update the value of control information from one cycle to the next based on equation (1). For example, the value (e.g., updated value) of control information PH_CTL[0] in cycle n+1 is equal to the value of control information PH_CTL[0] in cycle n minus the product of coefficient K and $PW_{INL}$ ($PW_{INL}$ is the INL vector). In another example, the value (e.g., updated value) of control information PH_CTL[1] in cycle n+1 is equal to the value of control information PH_CTL[1] in cycle n minus the product of coefficient K and $PW_{INL}$ ($PW_{INL}$ is the INL vector).

As described above clock calibration unit 125 can end a clock calibration operation when the number of cycles performed in the clock calibration operation reaches a selected number of cycle (e.g., X cycles) if the selected number of cycles is one of calibration criteria. Thus, clock calibration unit 125 can end the clock calibration operation in method 500 if index n in equation (1) reaches X (e.g., n=X).

In equation (1), coefficient (e.g., a constant) K is a fixed value. coefficient K can be selected based on the relationship (e.g., ratio) between the change in the pulse width (in time units) and the change the value (e.g., a digital code) of the INL caused by the change in the pulse width. For example, assuming that 1 picosecond change in the pulse width translates to a change in 1000 codes in the INL, and assume that each code (one code) in control information PH_CTL changes the phase of the corresponding clock signal by 100 fs. In this example, if the pulse width is change by 1 ps=1000 fs, then (based on the assumption above) the $PW_{INL}$ will give 1000 codes. In this example, if K is selected to be K=1/500, then from equation (1), $K*PW_{INL}=(1/500)*1000$ codes=2 codes. This means, from equation (1), control information PH_CTL will cause the error of 1000 fs to be reduced by two codes, which is 200 fs. The errors can be gradually reduced and converge to near zero in subsequent cycles of the clock calibration operation. In this example, if coefficient is select to be a smaller value (e.g., less than 1/500), then it may take longer to achieve convergence. Thus, coefficient K can be selected to at a value allow a gradual decrease in phase errors but not too small because it may lengthen the convergence time.

In method 500, the calculations of the pulse width vector, the DNL vector, the INL vector, and the control vector PH_CTL described in the above activities can be performed by calculation and control circuitry 235 (FIG. 2) of clock calibration unit 125. Thus, calculation and control circuitry 235 can include components such as a state machine (e.g., finite state machine), register circuits (e.g., control registers 121), read-only-memory (ROM), and other components that can be configured to perform the calculations and other activities of method 500, as described herein.

Activity 522 of method 500 in FIG. 5 can include adjusting clock phases ph0 through ph7 based on the control vector calculated from equation (1). Adjusting clock phases ph0 through ph7 in activity 522 can include updating the values (e.g., digital control code) of control information PH_CTL[0] through PH_CTL[7] in FIG. 2 based on equation (1) above. For an optimal convergence of the INLs of clock phases ph0 through ph7, clock calibration unit 125 can be configured to operate to have the amount of time delay applied to a clock signal (e.g., clock signal CLK0) associated with a clock phase (e.g., clock phase ph0) proportional to the value of the control information (e.g., PH_CTL[0]) used to the control the amount of time delay applied to that clock signal. This allows a consistence loop bandwidth, optimize convergence time, and have equal weights to the clock phases in the convergence process, which can result in a more balanced convergence.

Activity 526 of method 500 of FIG. 5 can include determining whether calibration criteria is met. The calibration criteria can be based on peak-to-peak INLs of clock phases ph0 through ph7 relative to a selected range (e.g., range 401 in FIG. 4). Alternatively, or additionally, calibration criteria in activity 526 can be based on the number of cycles (e.g., n) performed in the clock calibration operation relative to a selected number of cycles (e.g., X, as described above with reference to FIG. 4).

Method 500 can continue with activity 526 if the calibration criteria in activity 526 is met (as indicated by "YES"). In activity 526 clock calibration unit 125 (FIG. 2) can end the clock calibration operation.

Method 500 can repeat activities 512 through 524 at least one more cycle time if the calibration criteria in activity 526 is not met (as indicated by "NO"). For example, method 500 can repeat activities 512 through 524 until peak-to-peak INLs of clock phases ph0 through ph7 is within the selected range (e.g., range 401 in FIG. 4), or until the number of cycles performed in the clock calibration operation reaches the selected number of cycles (e.g., until n=X), or both, depending on the calibration criteria being selected.

In the clock calibration operation described above with reference to FIG. 2 through FIG. 7, an 8-UI pattern of data having "10000000" (an 8 UI-pattern of 1-high 7-low signal levels) is used as an example. However, the pattern of data having different values can be used for an 8-UI pattern. For example, an 8-UI pattern of data having values "11100000" (3-high 5-low) can be used. Further, a pattern of data different from 8-UI pattern can be use. For example, 16-UI pattern of data can be used. The INL should be constructed differently per clock pattern. For example, for a 3-high 5-low pattern, the INL can be constructed as follows.

$$PW_{INL} = \begin{pmatrix} 0 \\ PW_{INL}[6] + PW_{DNL}[1] \\ PW_{INL}[7] + PW_{DNL}[2] \\ PW_{INL}[0] + PW_{DNL}[3] \\ PW_{INL}[1] + PW_{DNL}[4] \\ PW_{INL}[2] + PW_{DNL}[5] \\ PW_{INL}[3] + PW_{DNL}[6] \\ PW_{INL}[4] + PW_{DNL}[7] \end{pmatrix}$$

Clock calibration unit 125 (FIG. 2) can perform a clock calibration operation (e.g., in method 500) periodically, non-periodically, or both. For example, clock calibration unit 125 can be configured to periodically perform a clock calibration operation after very pre-determined time interval (e.g., after a predetermined amount of time has passed). In another example, clock calibration unit 125 can be configured perform the calibration operation non-periodically, such that clock calibration unit 125 can perform a clock calibration operation in response to operating voltage, temperature, or current consumption reaching specific values, or in response to other conditions.

As described above with reference to FIG. 2 through FIG. 5, clock calibration unit 125 can perform a clock calibration operation to adjust clock phases ph0 through ph7 provided to transmitting circuit 112 of transmitter 120 (FIG. 1). Clock calibration unit 115 of transmitter 110 can also be configured to perform the clock calibration operation described above to adjust clock phases of clock signals CLK0'-CLK315' provided to transmitting circuit 112 of transmitter 120 (FIG. 1).

Transmitter 120 can be a replica of transmitter 110, such that transmitter 120 can include circuit element similar to or the same as those of transmitter 110. During a normal operation (which is different from the clock calibration operation) of device 100 (FIG. 1), transmitter 110 can be activated to transmit data DATA_OUT from output 114 to an additional device (another device different from device 100). During a normal operation of device 100, transmitter 120 can be deactivated (disabled) while transmitter 110 is activated to transmit data. Alternatively, during a normal operation of device 100, transmitter 120 can be activated to perform a clock calibration operation (e.g., performed in the background) described above.

Clock calibration units 115 and 125 (FIG. 1) of transmitters 110 and 120 can perform respective clock calibration operations independently from each other. Clock calibration units 115 and 125 can concurrently perform (e.g., perform at the same time) respective clock calibration operations. Alternatively, clock calibration units 115 and 125 can perform respective clock calibration operations at different times. Thus, clock calibration units 115 and 125 can be configured such that clock calibration unit 125 can perform a clock calibration operation at transmitter 120 at a particular time while clock calibration unit 115 may not perform a clock calibration operation at transmitter 110.

Figure 6:
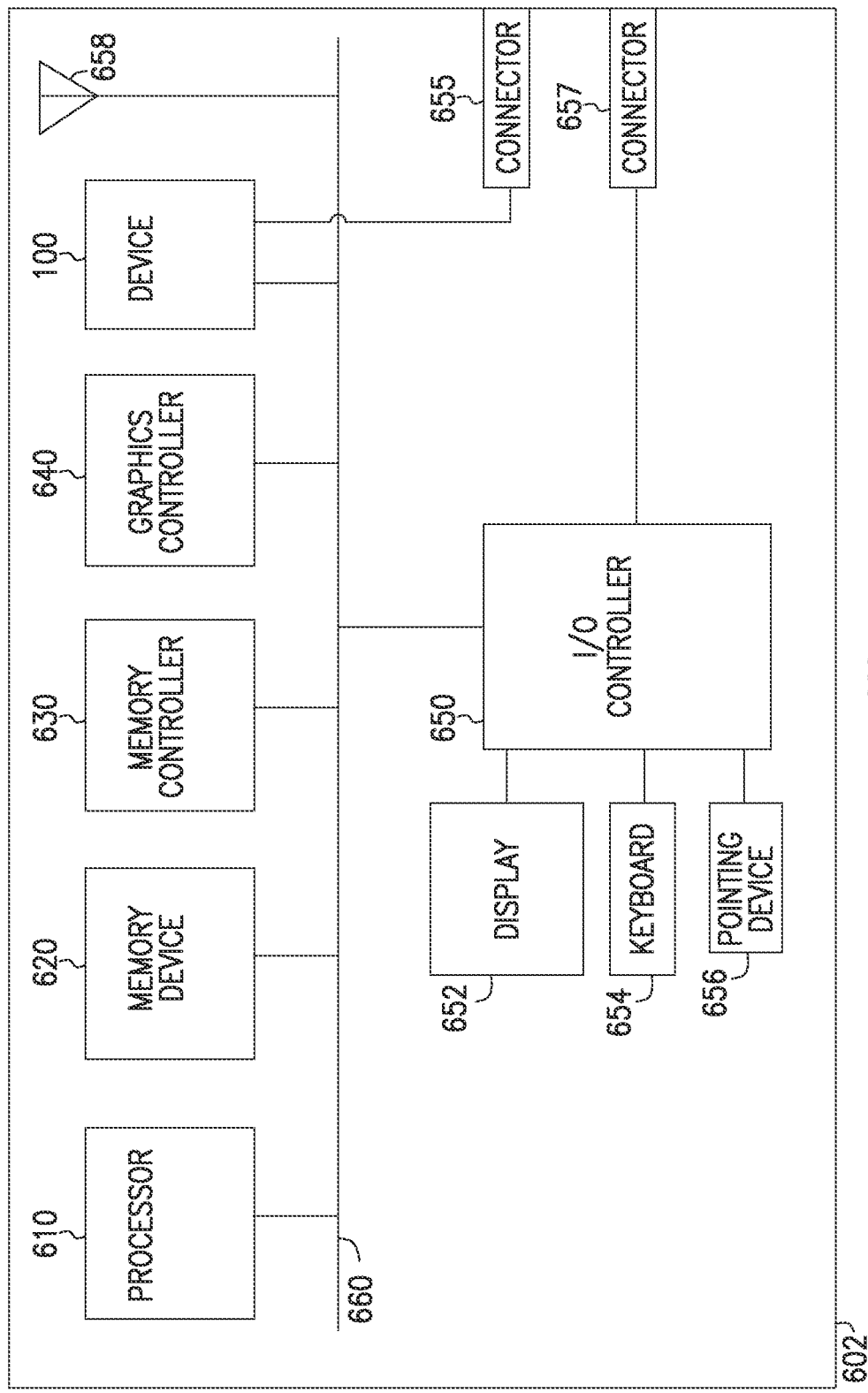
FIG. 6 shows a block diagram of a machine (e.g., a computer system) including the device of FIG. 1, according to some embodiments described herein.

FIG. 6 shows an apparatus in the form of a system (e.g., electronic system) 600, according to some embodiments described herein. System 600 can include or be included in a computer, a tablet, or other electronic system. As shown in FIG. 6, system 600 can include components located on a circuit board (e.g., printed circuit board (PCB)) 602, such as device 100, a processor 610, a memory device 620, a memory controller 630, a graphics controller 640, an I/O controller 650, a display 652, a keyboard 654, a pointing device 656, at least one antenna 658, connectors 655, and 657, and a bus 660. Bus 660 can include conductive lines (e.g., metal-based traces on a circuit board where the components of system 600 are located).

In some arrangements, system 600 does not have to include a display. Thus, display 652 can be omitted from system 600. In some arrangements, system 600 does not have to include any antenna. Thus, antenna 658 can be omitted from system 600. In some arrangements, system 600 does not have to include a connector. Thus, one or both of connectors 655 and 657 can be omitted from system 600.

Processor 610 can include a general-purpose processor, an application specific integrated circuit (ASIC), or other kinds of processors. Processor 610 can include a CPU.

Memory device 620 can include a dynamic random-access memory (DRAM) device, a static random-access memory (SRAM) device, a flash memory device, phase change memory, a combination of these memory devices, or other types of memory. FIG. 6 shows an example where memory device 620 is a stand-alone memory device separated from processor 610. In an alternative arrangement, memory device 620 and processor 610 can be located on the same die. In such an alternative arrangement, memory device 620 is an embedded memory in processor 610, such as embedded DRAM (eDRAM), embedded SRAM (eSRAM), embedded flash memory, or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antenna 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Each of connectors 655 and 657 can be arranged (e.g., can include terminals (e.g., pins)) to allow system 600 to be coupled to an external device (or system). This may allow system 600 to communicate (e.g., exchange information) with such a device (or system) through connectors 655 and 657. In an example, connector 655 can include or can be an Ethernet port, which can include conductive lines that conform with Ethernet specifications. Alternatively, connector 655 can include another type of port different from an Ethernet port that conform with at least one of USB, DP, HDMI, Thunderbolt, and PCIe, and other specifications. Connector 657 and at least a portion of bus 660 can include conductive lines that conform with at least one of USB, DP, HDMI, Thunderbolt, PCIe, Ethernet, and other specifications.

FIG. 6 shows the components of system 600 arranged separately from each other as an example. For example, each of device 100, processor 610, memory device 620, memory controller 630, graphics controller 640, and I/O controller 650 can be located on a separate IC (e.g., semiconductor die or an IC chip). In some arrangements, two or more components (e.g., device 100, processor 610, memory device 620, graphics controller 640, and I/O controller 650) of system 600 can be located on the same die (e.g., same IC chip) that can be part of a system on chip (SoC), a system in a package (SiP), or other electronic devices or systems.

The illustrations of the apparatuses (e.g., device 100 and system 600 including, clock calibration units 115 and 125) and methods (e.g., method 500) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

Additional Notes and Examples

Example 1 includes subject matter (such as a device, an electronic apparatus (e.g., circuit, electronic system, or both), or a machine) including a clock generator to generate clock signals, the clock signals being out of phase with each other, a transmitting circuit to provide patterns of data at an output of the transmitting circuit responsive to timing of the clock signals, and calculation and control circuitry to calculate an integral nonlinearity vector that represents offsets of transitions of the patterns from respective target positions, and to generate control information based on the integral nonlinearity vector to adjust phases of the clock signals based on the control information.

In Example 2 the subject matter of Example 1, wherein the calculation and control circuitry are configured to calculate a differential nonlinearity vector based on pulse widths of unit intervals associated with the patterns of data at the output of the transmitting circuit, and the integral nonlinearity vector is calculated based on the differential nonlinearity vector.

In Example 3 the subject matter of Example 1, wherein the clock signals include eight clock signals having eight respective phases and the control information includes eight different control codes to adjust the eight clock signals, respectively.

In Example 4 the subject matter of Example 1, wherein the calculation and control circuitry is configured to generate the control information during a clock calibration operation.

In Example 5 the subject matter of Example 1, wherein the calculation and control circuitry is configured to linearly adjust phases of the clock signals based on the control information.

In Example 6 the subject matter of Example 1, wherein the patterns of data include a repeating pattern of one unit interval of a first signal level followed by a number consecutive unit intervals of a second signal level.

Example 7 includes subject matter (such as a device, an electronic apparatus (e.g., circuit, electronic system, or both), or a machine) including tunable delay circuits having respective first inputs to receive respective clock signals and respective second inputs receive respective control information, the tunable delay circuits configured to adjust phases of the respective clock signals responsive to the respective control information, a transmitting circuit including an 8:1 multiplexer to receive input data and an output to transmit output data based on timing of the clock signals, the output data having transitions based on the input data, and calculation and control circuitry to generate an integral nonlinearity vector based on transitions of the output data the output of the transmitting circuit, and to generate the control information based on the integral nonlinearity.

In Example 8 the subject matter of Example 7, wherein the input data include includes a repeating pattern of one unit interval of a first signal level followed by seven consecutive unit intervals of a second signal level.

In Example 9 the subject matter of Example 8, wherein the first signal level is higher than the second signal level.

In Example 10 the subject matter of Example 7, wherein the tunable delay circuits include eight tunable delay circuits, and the control information include eight different digital codes provided to respective second inputs of the tunable delay circuits.

In Example 11 the subject matter of Example 10, wherein the eight digital codes have respective values proportional to position errors of the phases the respective clock signals.

Example 12 includes subject matter (such as a device, an electronic apparatus (e.g., circuit, electronic system, or both), or a machine) including generating clock phases including eight different clock phases, providing input data to a transmitting circuit, transmitting output data at an output of the transmitting circuit based on timing of the clock phases, calculating an integral nonlinearity vector that represents offset of transitions of the output data from respective target positions, calculating control information based on the integral nonlinearity vector, and adjusting the clock phases based on the control information.

In Example 12 the subject matter of Example 12, wherein the input data include a repeating pattern of data.

In Example 14 the subject matter of Example 13, wherein the repeating pattern of data includes one unit interval of a first signal level followed by a number consecutive unit intervals of a second signal level.

In Example 15 the subject matter of Example 14, wherein the first signal level is higher than the second signal level.

In Example 16 the subject matter of Example 12, wherein the output data includes a repeating pattern of data.

In Example 17 the subject matter of Example 12, further comprising stop adjusting the clock phases responsive to offsets of transitions of the output data from respective target positions being within a selected range.

In Example 18 the subject matter of Example 12, wherein adjusting the clock phases is performed during a clock calibration operation, calculating the control information includes updating values of the control information in a number of cycles during the clock calibration operation, and stopping the adjusting the clock phases responsive to the number of cycles reaches a selected number.

Example 19 includes subject matter (such as a method for operating a device, an electronic apparatus (e.g., circuit, electronic system, or both), or a machine) including a device including a clock generator to generate clock signals, the clock signals being out of phase with each other, a transmitting circuit to provide patterns of data at an output of the transmitting circuit responsive to timing of the clock signals, and calculation and control circuitry to calculate an integral nonlinearity vector that represents offsets of transitions of the patterns from respective target positions, and to generate control information based on the integral nonlinearity vector to adjust phases of the clock signals based on the control information, and an Ethernet port coupled to the transmitting circuit.

In Example 20 the subject matter of Example 19, wherein the transmitting circuit includes a driver including an output coupled to the output of the transmitting circuit, and an 8:1 multiplexer including an output coupled an input of the driver.

The subject matter of Example 1 through Example 20 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a clock generator to generate clock signals, the clock signals being out of phase with each other;
a transmitting circuit to provide patterns of data at an output of the transmitting circuit responsive to timing of the clock signals; and
calculation and control circuitry to calculate an integral nonlinearity vector that represents offsets of transitions of the patterns from respective target positions, to generate control information based on the integral nonlinearity vector to adjust phases of the clock signals based on the control information, and to stop adjusting the phases of the clock signals responsive to the offsets of transitions from the respective target positions being within a selected range.

2. The apparatus of claim 1, wherein the calculation and control circuitry are configured to calculate a differential nonlinearity vector based on pulse widths of unit intervals associated with the patterns of data at the output of the transmitting circuit, and the integral nonlinearity vector is calculated based on the differential nonlinearity vector.

3. The apparatus of claim 1, wherein the clock signals include eight clock signals having eight respective phases and the control information includes eight different control codes to adjust the eight clock signals, respectively.

4. The apparatus of claim 1, wherein the calculation and control circuitry is configured to generate the control information during a clock calibration operation.

5. The apparatus of claim 1, wherein the calculation and control circuitry is configured to linearly adjust phases of the clock signals based on the control information.

6. The apparatus of claim 1, wherein the patterns of data include a repeating pattern of one unit interval of a first signal level followed by a number consecutive unit intervals of a second signal level.

7. The apparatus of claim 1, further comprising an Ethernet port coupled to the transmitting circuit.

8. The apparatus of claim 7, wherein the transmitting circuit includes a driver including an output coupled to the output of the transmitting circuit, and an 8:1 multiplexer including an output coupled to an input of the driver.

9. An apparatus comprising:
tunable delay circuits having respective first inputs to receive respective clock signals and respective second inputs receive respective control information, the tunable delay circuits configured to adjust phases of the respective clock signals responsive to the respective control information;
a transmitting circuit including an 8:1 multiplexer to receive input data and an output to transmit output data based on timing of the clock signals, the output data having transitions based on the input data; and
calculation and control circuitry to generate an integral nonlinearity vector based on transitions of the output data at the output of the transmitting circuit, to generate the control information based on the integral nonlinearity vector, and to stop adjusting the phases of the respective clock signals responsive to offsets of the transitions of the output data from respective target positions being within a selected range.

10. The apparatus of claim 9, wherein the input data include includes a repeating pattern of one unit interval of a first signal level followed by seven consecutive unit intervals of a second signal level.

11. The apparatus of claim 10, wherein the first signal level is higher than the second signal level.

12. The apparatus of claim 9, wherein the tunable delay circuits include eight tunable delay circuits, and the control information include eight different digital codes provided to respective second inputs of the tunable delay circuits.

13. The apparatus of claim 12, wherein the eight digital codes have respective values proportional to position errors of the phases the respective clock signals.

14. A method comprising:
generating clock phases including eight different clock phases;
providing input data to a transmitting circuit;
transmitting output data at an output of the transmitting circuit based on timing of the clock phases;
calculating an integral nonlinearity vector that represents offset of transitions of the output data from respective target positions;
calculating control information based on the integral nonlinearity vector;
adjusting the clock phases based on the control information; and stop adjusting the clock phases responsive to offsets of transitions of the output data from respective target positions being within a selected range.

15. The method of claim 12, wherein the input data include a repeating pattern of data.

16. The method of claim 15, wherein the repeating pattern of data includes one unit interval of a first signal level followed by a number consecutive unit intervals of a second signal level.

17. The method of claim 16, wherein the first signal level is higher than the second signal level.

18. The method of claim 14, wherein the output data includes a repeating pattern of data.

19. A method comprising:
generating clock phases including eight different clock phases;
providing input data to a transmitting circuit;
transmitting output data at an output of the transmitting circuit based on timing of the clock phases;
calculating an integral nonlinearity vector that represents offset of transitions of the output data from respective target positions;
calculating control information based on the integral nonlinearity vector; and
adjusting the clock phases based on the control information, wherein:
adjusting the clock phases is performed during a clock calibration operation;
calculating the control information includes updating values of the control information in a number of cycles during the clock calibration operation; and
stopping the adjusting the clock phases responsive to the number of cycles reaches a selected number.

* * * * *